(12) United States Patent
Oh

(10) Patent No.: US 10,056,509 B2
(45) Date of Patent: Aug. 21, 2018

(54) APPARATUS FOR GENERATING POWER BY AMPLIFYING SUNLIGHT

(71) Applicant: Richard Oh, Los Angeles, CA (US)

(72) Inventor: Richard Oh, Los Angeles, CA (US)

( * ) Notice: Subject to any disclaimer, the term of this patent is extended or adjusted under 35 U.S.C. 154(b) by 58 days.

(21) Appl. No.: 15/202,753

(22) Filed: Jul. 6, 2016

(65) Prior Publication Data

US 2017/0025553 A1   Jan. 26, 2017

(30) Foreign Application Priority Data

Jul. 20, 2015   (KR) .......... 10-2015-0102262

(51) Int. Cl.

| | | |
|---|---|---|
| *H01L 31/00* | (2006.01) | |
| *H01L 31/0232* | (2014.01) | |
| *H01L 31/054* | (2014.01) | |
| *F24J 2/05* | (2006.01) | |
| *F24J 2/08* | (2006.01) | |
| *F24J 2/34* | (2006.01) | |
| *F24J 2/54* | (2006.01) | |
| *H02S 20/30* | (2014.01) | |
| *H02S 40/22* | (2014.01) | |
| *H02S 40/38* | (2014.01) | |
| *H02S 40/44* | (2014.01) | |
| *F24J 2/10* | (2006.01) | |

(52) U.S. Cl.
CPC .......... *H01L 31/0232* (2013.01); *F24J 2/055* (2013.01); *F24J 2/085* (2013.01); *F24J 2/345* (2013.01); *F24J 2/541* (2013.01); *H01L 31/0543* (2014.12); *H01L 31/0547* (2014.12); *H02S 20/30* (2014.12); *H02S 40/22* (2014.12); *H02S 40/38* (2014.12); *H02S 40/44* (2014.12); *F24J 2002/1004* (2013.01); *Y02E 10/50* (2013.01); *Y02E 10/60* (2013.01)

(58) Field of Classification Search
CPC ............ H01L 31/0232; H01L 31/0543; H01L 31/0547; F24J 2/085; F24J 2/541; F24J 2/055; F24J 2/345; F24J 2002/1004; H02S 40/22; H02S 20/30; H02S 40/44; H02S 40/38; Y02E 10/60; Y02E 10/50
USPC ....................................................... 136/256
See application file for complete search history.

(56) References Cited

U.S. PATENT DOCUMENTS

2013/0061911 A1\*   3/2013   Shin ........................ F24J 2/08
                                                            136/248

FOREIGN PATENT DOCUMENTS

| JP | 3185654 B2 | * | 7/2001 | .............. F24J 2/055 |
|---|---|---|---|---|
| KR | 20000036516 A | * | 7/2000 | |
| KR | 20110115973 A | * | 10/2011 | .............. F24J 2/542 |

(Continued)

*Primary Examiner* — Angelo Trivisonno
(74) *Attorney, Agent, or Firm* — Nixon & Vanderhye P.C.

(57) ABSTRACT

Disclosed is an apparatus for generating power by amplifying sunlight, including a sunlight amplifying means; and an energy storing means configured to support the sunlight amplifying means and to store an electric energy and a thermal energy generated from the sunlight amplifying means, wherein the sunlight amplifying means includes a first pipe formed of metallic material; a second pipe configured to enclose the first pipe; a solar photovoltaic module installed between the first pipe and the second pipe; and a sunlight amplifying sheet configured with concave mirrors or convex lenses having predetermined shapes and attached to the outer circumference of the second pipe so as to amplify sunlight.

11 Claims, 9 Drawing Sheets

(56) References Cited

FOREIGN PATENT DOCUMENTS

KR        20140045608 A  *  4/2014
KR        20140144353 A  *  12/2014
WO     WO-2010118038 A1  *  10/2010  ................. F24J 2/08

* cited by examiner

FIG. 3
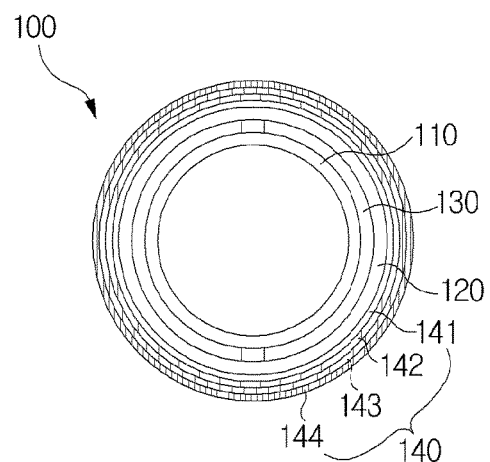
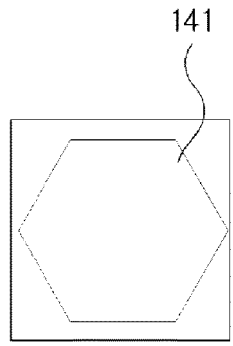
FIG. 4A
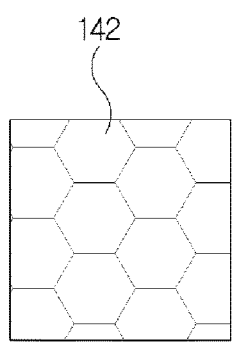
FIG. 4B
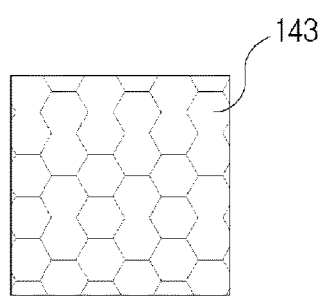
FIG. 4C
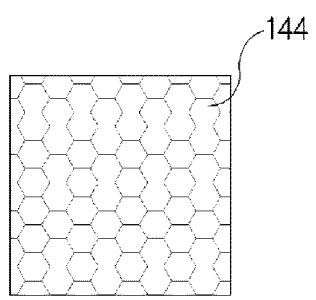
FIG. 4D

APPARATUS FOR GENERATING POWER BY AMPLIFYING SUNLIGHT

CROSS-REFERENCE TO RELATED APPLICATION

This application claims priority to and the benefit of Korean Patent Application No. 2015-0102262, filed on Jul. 20, 2015, the disclosure of which is incorporated herein by reference in its entirety.

BACKGROUND

1. Field of the Invention

The present invention relates to an apparatus for generating power by concentrating and amplifying sunlight.

2. Discussion of Related Art

Increasing attention has been received to a new renewable energy which can replace fossil fuel having a finite amount, such as coal, petroleum and natural gas, and an atomic energy which may bring about tremendous disaster against the environment. The new renewable energy includes kinetic energy, thermal energy, light energy and so on, which are generated from water power, wind power, tidal power and sunlight. Among them, the most spotlighted new renewable energy is a sunlight energy which is not in fear of exhaustion and is environmentally-friendly.

A sunlight power generation system using such sunlight energy produces electric energy by directly using a thermal energy obtained from sunlight or by rotating a turbine using the thermal energy. Such sunlight power generation system is mainly used in house, building, factory, power plant or the like to supply heat and electric power to it.

However, since the sunlight power generation system should install a sunlight collection panel or a solar heat collector at outdoors to operate it, there are some disadvantages that a wide area is required to obtain a large amount of energy, and a high initial installation cost is involved. Also, since the sunlight power generation system is heavy, the installation place thereof is limited. Furthermore, in the case of polar regions which have less sunlight, it is impossible to obtain enough energy by using the sunlight power generation system.

SUMMARY OF THE INVENTION

The present invention is directed to an apparatus for generating power by amplifying sunlight, which is free from the limitation on installation space and is cost-effective in installation, due to miniaturization, and may obtain plenty of energy.

According to an aspect of the present invention, there is provided an apparatus for generating power by amplifying sunlight, including a sunlight amplifying means configured to collect and amplify sunlight; and an energy storing means configured to support the sunlight amplifying means and to store an electric energy and a thermal energy generated from the sunlight amplifying means, wherein the sunlight amplifying means includes a first pipe formed of metallic material and configured to accommodate a gas, liquid, gel or solid type heat transfer medium therein; a second pipe configured to enclose the first pipe; a solar photovoltaic module installed between the first pipe and the second pipe; and a sunlight amplifying sheet configured with concave mirrors or convex lenses having predetermined shapes and attached to the outer circumference of the second pipe so as to amplify sunlight, and wherein the sunlight amplifying sheet includes a plurality of light collection sheets formed of concave mirrors or convex lenses, and the concave mirrors or the convex lenses of the light collection sheets have sizes which become smaller or larger, in turn, from the outside of the second pipe toward the inside thereof in a radial direction.

Preferably, the concave mirrors or the convex lens of the sunlight amplifying sheet are formed of transport material having a heat-resisting property, and also formed to be separately attachable and detachable to the light collection sheet.

Preferably, the solar photovoltaic module may be configured with a plurality of solar cells which are arranged to be overlapped with each other centering on a concentric circle between the first pipe and the second pipe, wherein a pipe is arranged between the solar cells, and each pipe and the first pipe has a protrusion for transferring heat.

Here, the energy storing means may include a rotational unit which rotatably supports the sunlight amplifying means, and a heated water tank which stores a water heated using the thermal energy of the sunlight amplifying means, and the heated water tank may have an inlet port through which the water is introduced, and an outlet port through which the heated water is discharged.

Preferably, the energy storing means comprises a heated water supply port through which heated water in the heated water tank is supplied to an external boiler.

Preferably, the energy storing means comprises a vapor discharge port through which a high pressure vapor in the heated water tank is supplied to an external turbine.

Preferably, the energy storing means may include a charging part having a plurality of storage batteries which store an electric energy generated from the solar photovoltaic module, and an inverter which changes the current characteristic of the electric energy generated from the solar photovoltaic module.

Preferably, the heated water tank comprises a first tank which stores a hot water heated using the thermal energy of the sunlight amplifying means, and a second tank which is arranged around the first tank and stores a warm water having a temperature relatively lower than that of the hot water in the first tank.

Preferably, the energy storing means comprises a high pressure injector which is built in the energy storing means, extends to the outside of the energy storing means when being used, and injects a cleaning water to the surface of the sunlight amplifying means.

Preferably, the first and second pipes may be horizontally or vertically arranged to be rotatable by the rotational unit.

In addition, when the sunlight amplifying means is vertically arranged, a funnel-shaped light collection member whose area is increased upward may be installed at the upper end of the sunlight amplifying means, and at least one or more sunlight amplifying sheets may be attached on the surface of the light collection member.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 3 is a cross-sectional view of the sunlight amplifying means in the apparatus for generating power by amplifying sunlight according to the first embodiment of the present invention;

FIG. 4A illustrates the shape of a convex lens in the sunlight amplifying sheet;

FIG. 4B illustrates the shape of a convex lens in the sunlight amplifying sheet;

FIG. 4C illustrates the shape of a convex lens in the sunlight amplifying sheet;

FIG. 4D illustrates a single plano-convex lens;

DETAILED DESCRIPTION OF EXEMPLARY EMBODIMENTS

Figure 1:
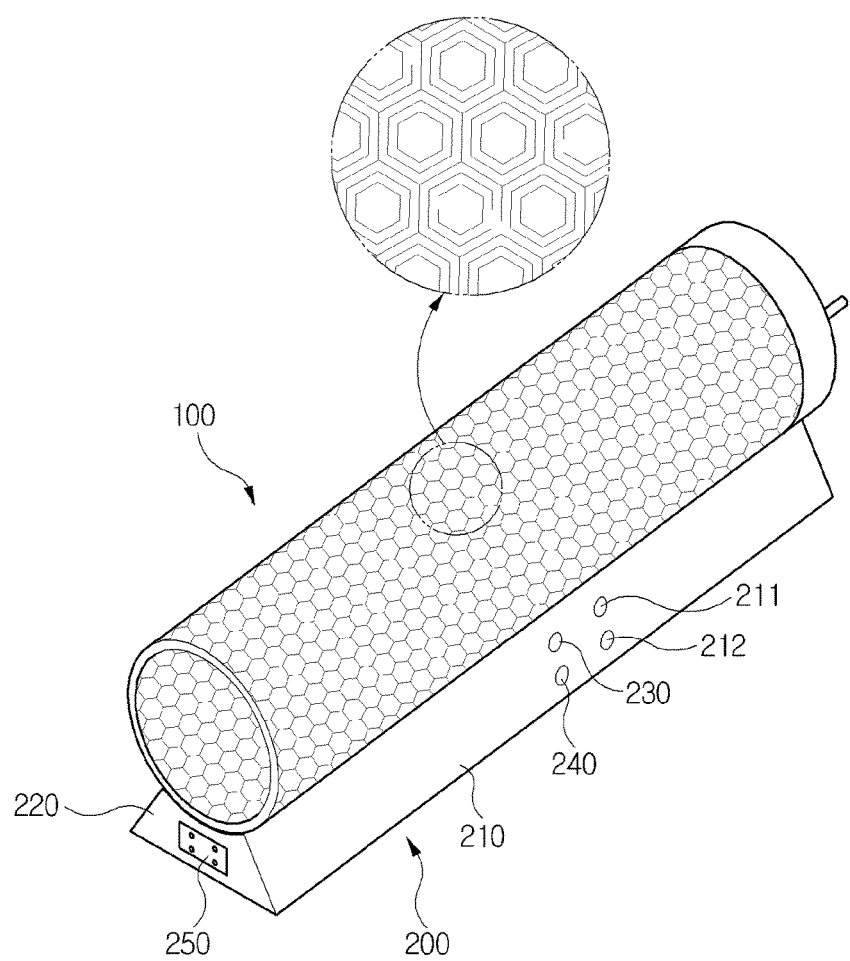
FIG. 1 is a perspective view schematically illustrating an apparatus for generating power by amplifying sunlight according to a first embodiment of the present invention.
Figure 2:
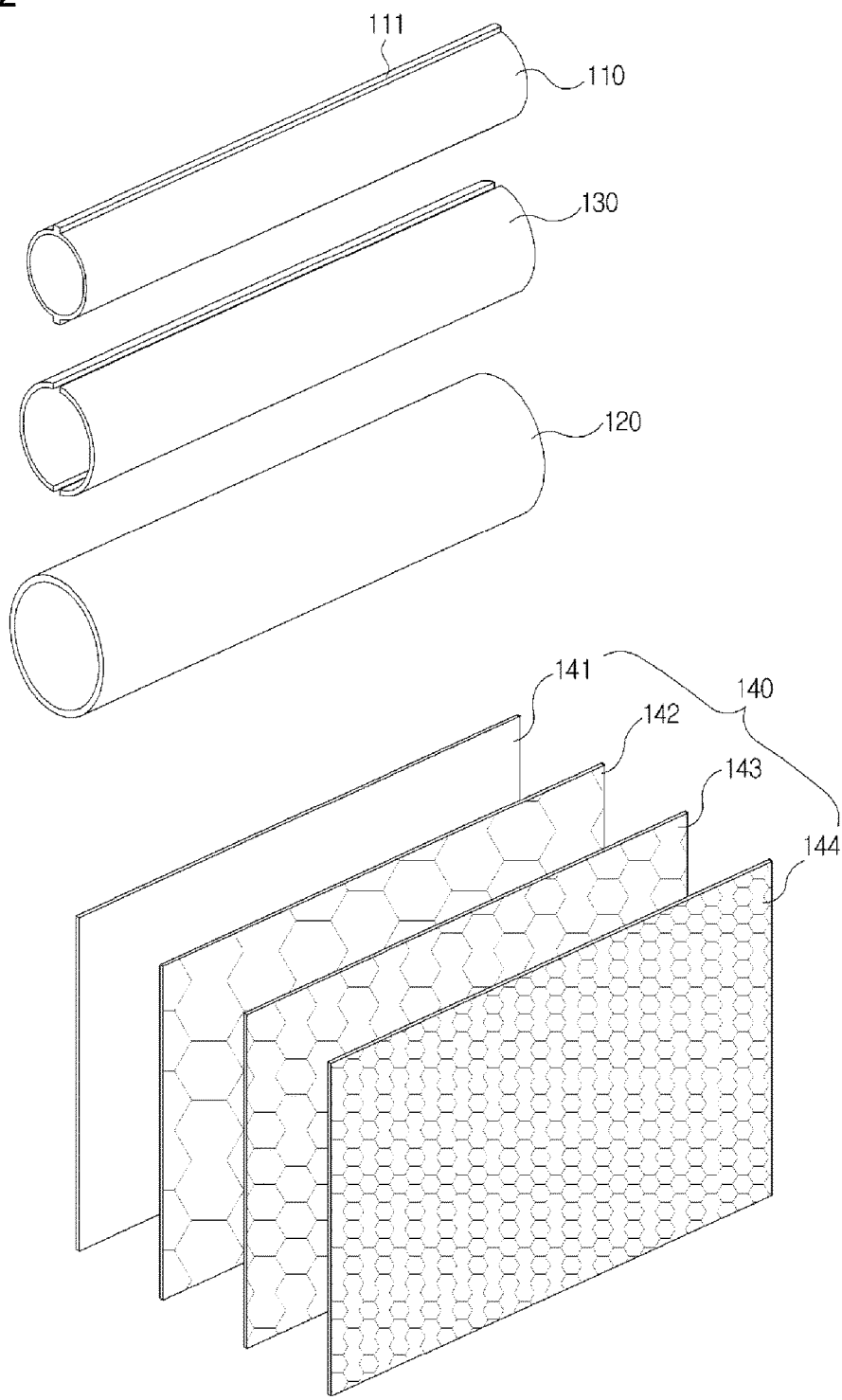
FIG. 2 is an exploded perspective view schematically illustrating a sunlight amplifying means in the apparatus for generating power by amplifying sunlight according to the first embodiment of the present invention.

Referring to FIGS. 1 to 3, an apparatus for generating power by amplifying sunlight according to the present invention includes a sunlight amplifying means 100 which collects and amplifies sunlight, and an energy storing means 200 which supports the sunlight amplifying means 100 and stores electric energy and thermal energy generated therefrom. Here, the sunlight amplifying means 100 generally is a cylindrical structure, and includes a first pipe 110, a second pipe 120, a solar photovoltaic module 130 and a sunlight amplifying sheet 140.

The first pipe 110 accommodates a gas, liquid, gel or solid type heat transfer medium therein, and the heat transfer medium is heated to a predetermined temperature or more by sunlight. The first pipe 110 may be formed of metallic material, such as copper and copper alloy, to transfer high heat from sunlight. Also, the first pipe 110 may be formed of non-ferrous alloy which is heat-treated to have a heat-resisting property, for example, carbon material, in particular, graphene material.

The second pipe 120 has substantially the same shape as the first pipe 110, and also has a larger diameter than the first pipe 110, and encloses the first pipe 110. That is, the second pipe 120 accommodates the first pipe 110 therein. The second pipe 120 may be formed of transparent material. Also, the second pipe 120 may be formed of non-ferrous alloy which is heat-treated to have a heat-resisting property, for example, carbon material, in particular, graphene material.

The solar photovoltaic module 130 is installed between the first pipe 110 and the second pipe 120, and generates an electric energy using photoelectron-motive force generated by the sunlight radiated on the surface of the second pipe 120. Here, the solar photovoltaic module 130 may be configured with a pair of semi-cylindrical cells separated from each other, and each of the cells may be connected to a storage battery which will be described later.

The sunlight amplifying sheet 140 is a light collecting sheet which is configured with concave mirrors or convex lenses having predetermined shapes, attached to the outer circumferential surface of the second pipe 120, and serves to collect and amplify sunlight. And the sunlight amplifying sheet 140 includes a plurality of light collection sheets 141 to 144. In the drawing, four light collection sheets are illustrated, but the sunlight amplifying sheet 140 may include 2, 3, 4, . . . or n light collection sheets. And each of the light collection sheets 141 to 144 is configured with concave mirrors or convex lenses having predetermined shapes. Also, the sunlight amplifying sheet 140 may also be attached to the both side surfaces of the second pipe 120. Here, a cover member which can be opened/closed may be installed at the both side surfaces of the second pipe 120, and the 2, 3, 4, . . . or n light collection sheets 140 may be attached to the cover member.

Here, the concave mirrors or the convex lenses of one light collection sheet 141 may be formed to have different sizes from the concave mirrors or the convex lenses of another light collection sheet 142. And the concave mirrors or the convex lenses of one light collection sheet 141 are formed to have sizes larger than from those of the concave mirrors or the convex lenses of other light collection sheets 142, 143 and 144. That is, the concave mirrors or the convex lenses of the sunlight amplifying sheet 140 are disposed so that the sizes thereof are gradually larger outward in a radial direction of the second pipe 120. Of course, the concave mirrors or the convex lenses of the sunlight amplifying sheet 140 may be disposed so that the sizes thereof are gradually smaller outward in the radial direction of the second pipe 120 according to the shapes the concave mirrors or the convex lenses. The light collection sheets 141 to 144 of the sunlight amplifying sheet 140 may be arranged in any types as long as the sunlight which travels from outside toward inside can be amplified.

By such an arrangement of the convex lenses (or concave mirrors), i.e., the arrangement of the light collection sheets 141 to 144, the sunlight radiated on the surface of the sunlight amplifying sheet 140 may be collected and amplified while passing through the fourth light collection sheet 144, the third light collection sheet 143, the second light collection sheet 142 and the first light collection sheet 141. Therefore, the photoelectron-motive force generated from the solar photovoltaic module 130 may be considerably increased, and at the same time, the second pipe 120 may be heated to a high temperature. Then, the high temperature second pipe 120 transfers heat to the first pipe 110, and the heat transferred to the first pipe 110 increases the temperature of the heat transfer medium in the first pipe 110. At this point, the heat transfer medium in the first pipe 110 is heated to a high temperature, and a high pressure vapor is generated in the first pipe 110. Theoretically, electric energy and thermal energy are exponentially increased depending on the number of the light collection sheets 141 to 144 of the sunlight amplifying sheet 140, and thus a very high level of electric energy and thermal energy may be obtained.

Further, referring to FIG. 2, the first pipe 110 has a protrusion portion 111 which is inserted into the incised portion of the solar photovoltaic module 130. The protrusion portion 111 is arranged in a lengthwise direction of the first pipe 110, and inserted into the incised portion of the solar photovoltaic module 130, and thus a contact area between the first pie 110 and the solar photovoltaic module 130 is increased. Accordingly, heat transfer efficiency between the first pie 110 and the solar photovoltaic module 130 is more increased. Although not illustrated in the drawings, alternatively, the protrusion portion 111 may be provided at the second pipe 120, and thus the heat transfer efficiency between the second pie 120 and the solar photovoltaic module 130 may be increased. Furthermore, referring to FIG. 8, the solar cells are arranged on the protrusion of pipes 121 to 123 in a sequential order so that the efficiency of the apparatus for generating power by amplifying sunlight is maximized.

Referring to FIGS. 4a to 4d, the convex lens of the first light collection sheet 141 (refer to FIG. 4a) of the sunlight amplifying sheet 140 is formed in a hexagonal shape, and the convex lens of the second light collection sheet 142 (refer to FIG. 4b) has a size smaller than that of the convex lens of the first light collection sheet 141. And the convex lens of the third light collection sheet 143 (refer to FIG. 4c) has a size smaller than that of the convex lens of the second light collection sheet 142, the convex lens of the fourth light collection sheet 144 (refer to FIG. 4d) has a size smaller than that of the convex lens of the third light collection sheet 143. As described above, each of the light collection sheets 141 to 144 of the sunlight amplifying sheet 140 has a single plano-convex lens.

Figure 5A:
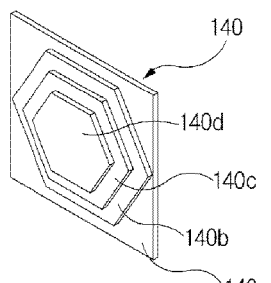
FIG. 5A illustrates the shape of a convex lens in the sunlight amplifying sheet.
Figure 5B:
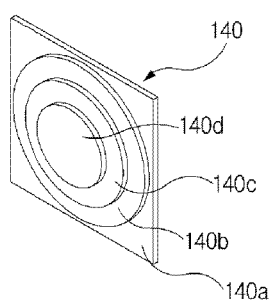
FIG. 5B illustrates the shape of a convex lens in the sunlight amplifying sheet.
Figure 5C:
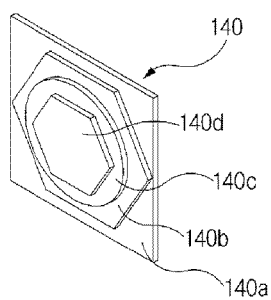
FIG. 5C illustrates the shape of a convex lens in the sunlight amplifying sheet.
Figure 5D:
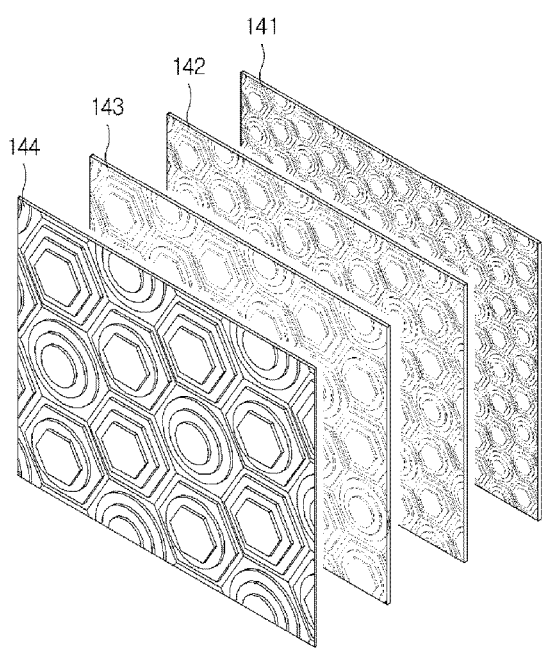
FIG. 5D illustrates a multi-convex lens.

Meanwhile, as referring to FIGS. 5a to 5c, the sunlight amplifying sheet 140 may be configured with one light collection sheet, and the one light collection sheet may have multi-shaped convex lenses 140a, 140b, 140c and 140d. Further, a plurality of multi-shaped light collection sheets may be provided and then coupled to each other. And as illustrated in FIG. 5d, the multi-shaped light collection sheets may be configured with the combination of the convex lenses having various shapes, and the light collection sheets may be arranged in turn according to the sizes thereof, and then may be attached to the second pipe 120.

Here, all of the convex lenses illustrated in FIGS. 4a to 4d and the convex lenses illustrated in FIGS. 5a to 5d may be formed to be separately attachable and detachable to the light collection sheet. Due to such a configuration, the convex lenses may be partially replaced in case of breakdown, abrasion or aging. Further, the light collection sheets having the convex lenses may be formed of a specially processed sheet having a heat-resisting property, e.g., a transparent urethane material having a heat-resisting property.

Referring to FIG. 1 again, the energy storing means 200 includes a rotational unit (not shown) which rotatably supports the above-described sunlight amplifying means 100, and a heated water tank 210 which heats water therein using the thermal energy of the sunlight amplifying means 100.

The rotational unit has an external appearance corresponding to that of the sunlight amplifying means 100, includes a support frame 220 on which the sunlight amplifying means 100 is horizontally seated, and the support frame 220 is provided with a rotating roller (not shown) which rotates the sunlight amplifying means 100 to rotate the sunlight amplifying means 100. Due to the rotational unit, sunlight may be uniformly collected on the surface of the sunlight amplifying sheet 140 of the sunlight amplifying means 100. Further, instead of the roller, a rotating shaft which is connected to the central shaft of the sunlight amplifying means 100 and rotates the sunlight amplifying means 100 may be provided at the support frame 220.

The heated water tank 210 has an inlet port 211 and an outlet port 212 which are provided inside the support frame 220 to introduce and discharge water. Here, underground water, rainwater, snow, seawater or the like may be provided inside the warm water tank 210. At this point, underground water, rainwater, snow, seawater or the like may be supplied into the heated water tank 210 in a state in which foreign substances are filtered through a separate rectification tank. And a water level measuring sensor (not shown) is installed inside the heated water tank 210, and an on-off valve (not shown) is installed at an inlet port 211 of the heated water tank 210. The on-off valve is opened/closed according to the measuring result of the water level measuring sensor, and supplies underground water into the heated water tank 210 through the inlet port 211.

And the underground water supplied into the heated water tank 210 is heated using the thermal energy generated from the sunlight amplifying means 100. Here, underground water may be heated through the heat transfer medium of the first pipe 110. At this point, the underground water stored in the heated water tank 210 may be heated to the very high temperature by the above-described sunlight amplifying means 100, and thus may be changed into hot water.

Further, the energy storing means 200 may have a heated water supply port 230 for supplying a warm water heated in the warm water tank 210 to an external boiler (not shown). And a hot water which is heated to the very high temperature by the sunlight amplifying means 100 may be introduced into the boiler through the heated water supply port 230, and may be used for heating of a building.

Further, the energy storing means 200 may have a vapor discharge port 240 for supplying a high pressure vapor generated in the heated water tank 210 to an external turbine (not shown). By supplying the vapor into the turbine, electric energy may be separately produced. Here, the energy storing means 200 may have a pressure measuring sensor (not shown) which measures the internal pressure of the heated water tank 210, and the vapor discharge port 240 may be automatically opened/closed according to the measuring result of the pressure measuring sensor.

And the supplying of underground water, the supplying of heated water and the supplying of vapor may be performed through an operation panel 250 provided at the support frame 220. The operation panel 250 may include a water supply button which controls the on/off valve of the inlet port 211, a heated water supply button which controls the opening/closing of the heated water supply port 230, and a vapor discharge button which controls the opening/closing of the vapor discharge port 240.

Figure 6:
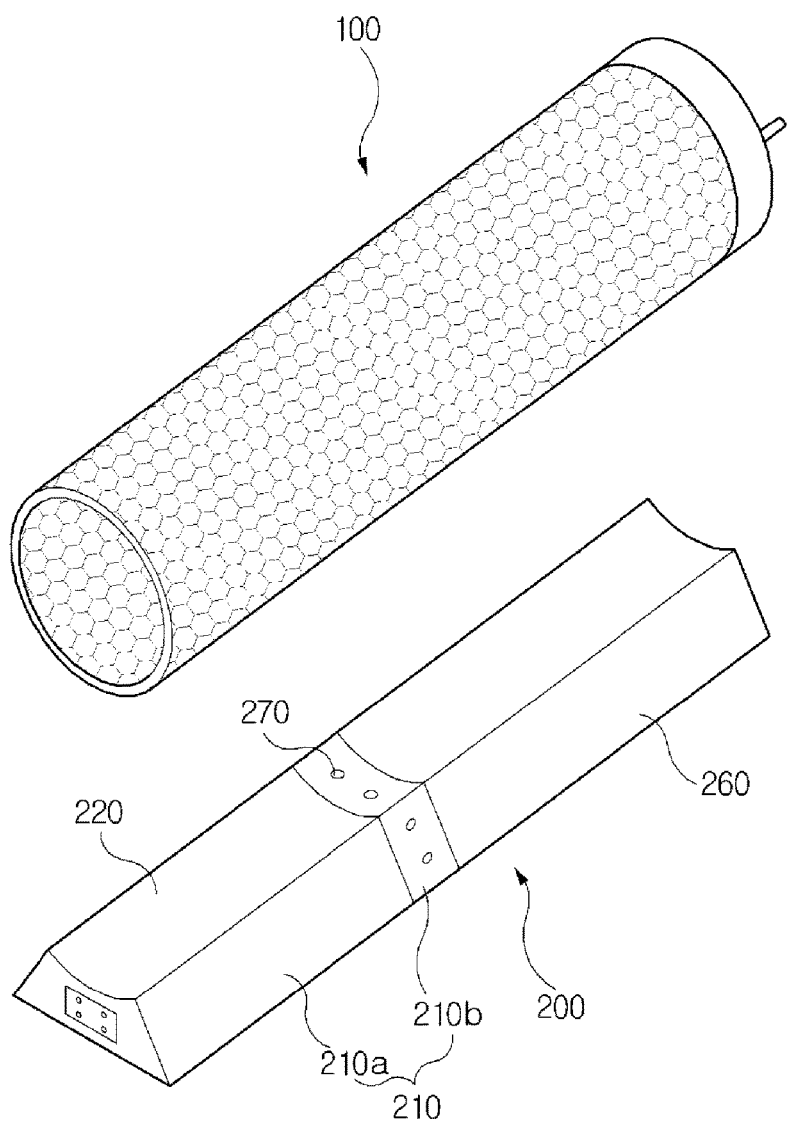
FIG. 6 is an exploded perspective view schematically illustrating the apparatus for generating power by amplifying sunlight according to a second embodiment of the present invention.
Figure 7:
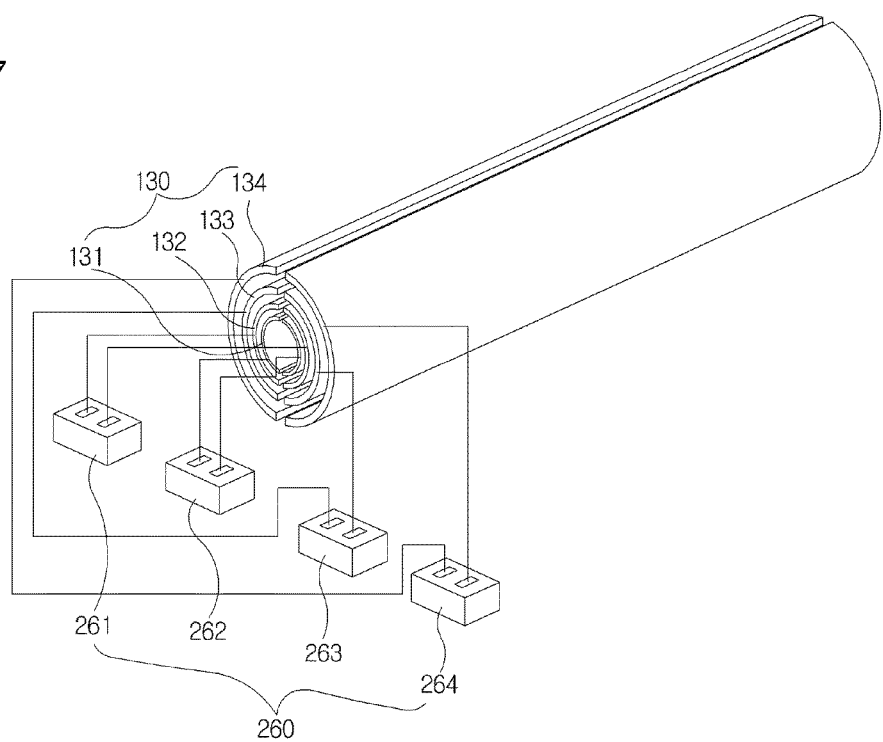
FIG. 7 is an exploded perspective view schematically illustrating a storage battery and a solar photovoltaic module of the sunlight amplifying means in the apparatus for generating power by amplifying sunlight according to the second embodiment of the present invention.
Figure 8:
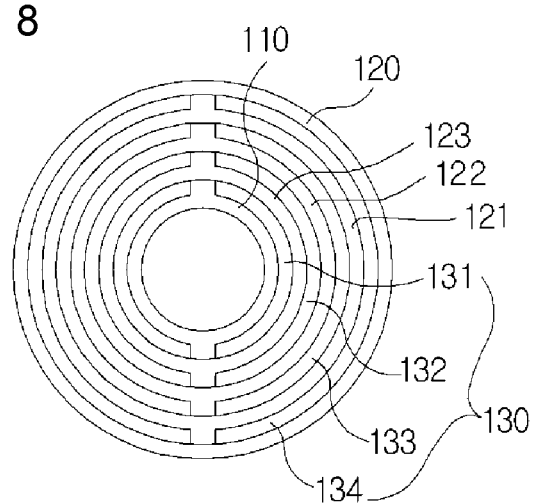
FIG. 8 is a cross-sectional view schematically illustrating the solar photovoltaic module of the sunlight amplifying means in the apparatus for generating power by amplifying sunlight according to the second embodiment of the present invention.

Referring to FIGS. 6 to 8, the apparatus for generating power by amplifying sunlight according to a second embodiment of the present invention is illustrated. The solar photovoltaic module 130 is configured with a plurality of solar cells 131 to 134 which are arranged to be overlapped with each other centering on a concentric circle between a plurality of the pipes 121 to 123 which are arranged between the first pipe 110 and the second pipe 120. And the solar cells 131 to 134 are individually connected to the storage battery which will be described later.

And the energy storing means 200 includes a charging part 260 which stores an electric energy generated from the solar photovoltaic module 130, and an inverter (not shown) which converts the current characteristic of the electric energy generated from the solar photovoltaic module 130.

The charging part 260 is provided with a separate space from the warm water tank 210 at one side of the support frame 220, and has a plurality of storage batteries 261 to 264 therein. The storage batteries 261 to 264 are high performance small lithium storage batteries, are provided with the number corresponding to that of the solar cells, and store an electric energy generated from each of the solar cells. In the drawing, four solar cells and four storage batteries are illustrated, but, if necessary, the number of solar cells and storage batteries may be changed.

The inverter serves to transfer direct current (DC) into alternating current (AC), and may be selectively operated according to the use environment of electric energy. For example, when the apparatus for generating power by amplifying sunlight according to the present invention is used to supply electric power to a small and medium building such as apartment or house, the inverter is operated to transfer DC obtained from the solar photovoltaic module 130 into AC. When the apparatus for generating power by amplifying sunlight according to the present invention is used to supply electric power to a large building such as a factory or plant, the inverter is not operated. Of course, when the apparatus for generating power by amplifying sunlight according to the present invention is used to supply plenty of electric power, it is not necessary to install the inverter. Further, the apparatus for generating power by amplifying sunlight according to the present invention may additionally have a converter.

Meanwhile, the heated water tank 210 may include a first tank 210a and a second tank 210b, and a hot water having high temperature may be stored in the first tank 210a, and a warm water having a relatively lower temperature may be stored in the second tank 210b. The second tank 210b in which the warm water is stored serves to prevent the pipes from freezing and bursting away in winter and also to buffer water supply.

And the heated water tank 210 may have a high pressure injector 270 which injects cleaning water on the surface of the sunlight amplifying means 100 to wash it. The high pressure injector 270 is detailedly illustrated in FIG. 9.

Figure 9:
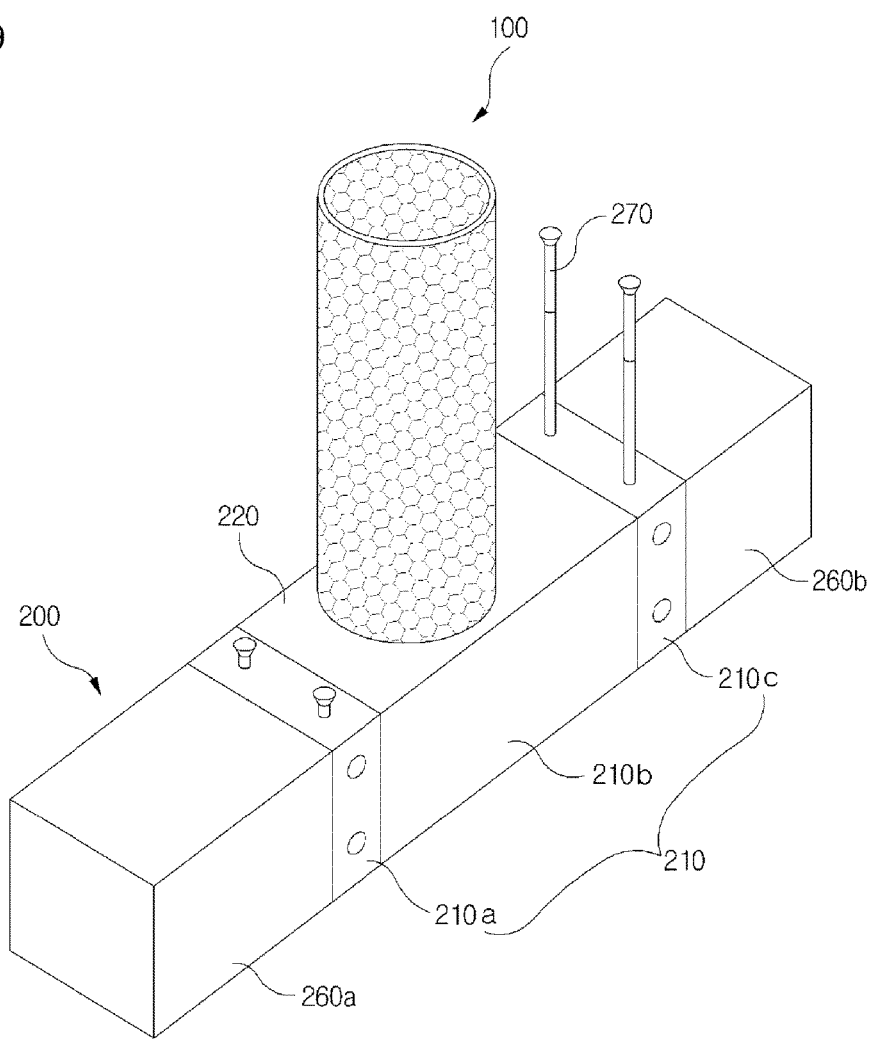
FIG. 9 is a perspective view schematically illustrating the apparatus for generating power by amplifying sunlight according to a third embodiment of the present invention.

Referring to FIG. 9, the apparatus for generating power by amplifying sunlight according to a third embodiment of the present invention is illustrated. Here, the sunlight amplifying means 100 may be vertically installed on the support frame 220 of the energy storing means 200. And the vertically installed sunlight amplifying means 100 is rotatably provided on the support frame 220.

Further, the warm water tank 210 includes a first tank 210a which stores the hot water, and a second tank 210b and a third tank 210c which are provided at both sides of the first tank 210a, respectively, and store the warm water having a temperature relatively lower than that of the hot water in the first tank 210a. Further, the energy storing means 200 includes a first charging part 260a which is provided outside the second tank 210b, and a second charging part 260b which is provided outside the third tank 210c. Here, the second charging part 260b may be an energy storage device which stores an electric energy generated from the turbine operated by the high temperature/pressure vapor in the first pipe 110, and may also be a large-sized energy storage device such as an energy storage system (ESS) which stores AC.

The apparatus for generating power by amplifying sunlight of such a vertical structure may be designed as a large generator which is proper to a place, such as a factory or plant, which requires plenty of electric energy, and the apparatus for generating power by amplifying sunlight of the above-described horizontal structure may be designed as a small and medium generator which is proper to a house, a shopping mall, an apartment or the like.

Meanwhile, the energy storing means 200 has a high pressure injector 270 which injects cleaning water on the surface of the sunlight amplifying means 100 to wash it. The high pressure injector 270 is formed to be built in the second tank 210b and the third tank 210c, and then to extend toward outside and inject a high pressure cleaning water when being used. The high pressure injector 270 may be a telescopic type injector which is contractible like telescope.

Figure 10:
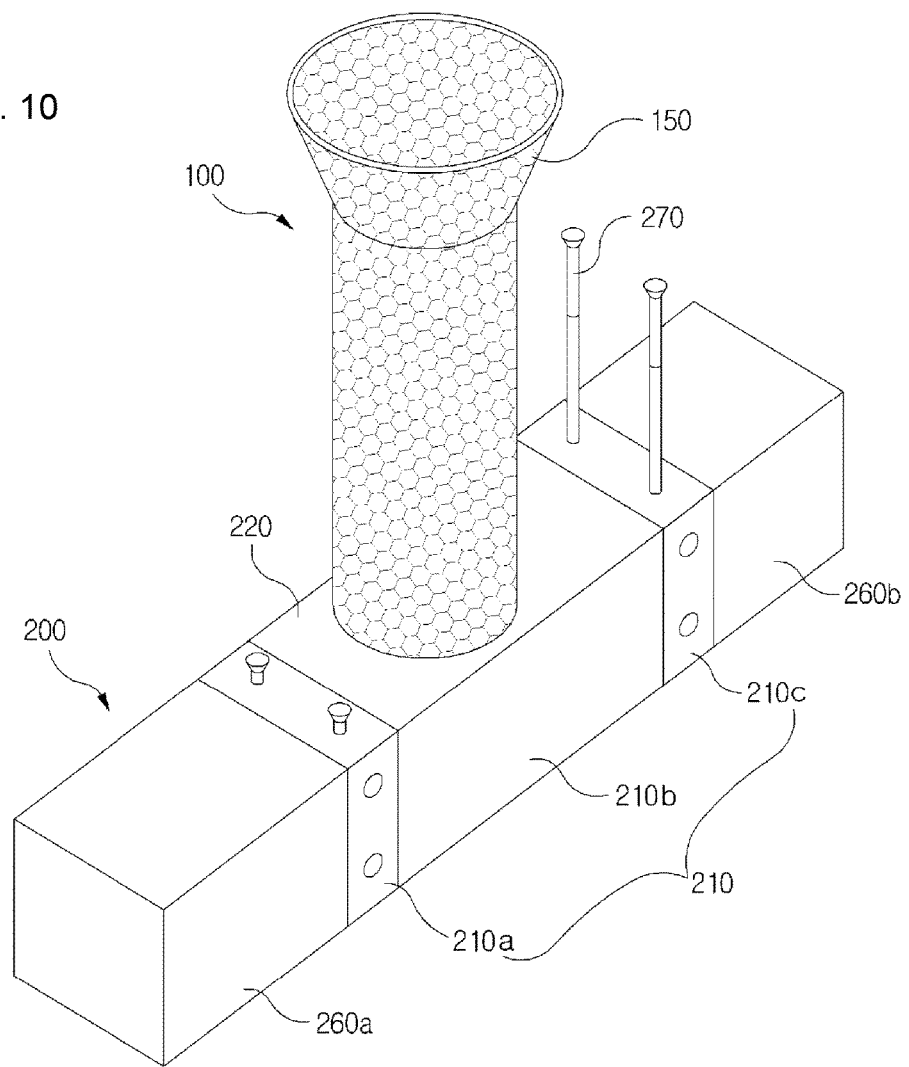
FIG. 10 is a perspective view schematically illustrating the apparatus for generating power by amplifying sunlight according to a fourth embodiment of the present invention.

Referring to FIG. 10, the apparatus for generating power by amplifying sunlight according to the third embodiment of the present invention is illustrated. Here, an additional funnel-shaped light collection member 150 whose area is increased upward is installed at the upper end of the sunlight amplifying means 100. And the above-described sunlight amplifying sheet 140 is attached to the surface of the light collection member 150. Here, the tilt angle of the light collection member 150 may be 20 to 45 degrees. And 1, 2, 3, . . . n, i.e., a plurality of sunlight amplifying sheets 140 overlapped with each other may be attached on the upper surface of the light collection member 150. Further, the plurality of sunlight amplifying sheets 140 overlapped with each other may also be attached on the outer surface of the light collection member 150.

Preferably, a cover which is opened/closed may be installed at the upper surface of the light collection member 150, and the sunlight amplifying sheets 140 may be attached on the surface of the cover. And the cover is formed to be opened/closed according to the measuring result of a pressure sensor (not shown) which measures an internal pressure of the sunlight amplifying means 100.

Meanwhile, the sunlight amplifying means 100 which is vertically installed may be formed as a telescopic type structure which is contractible like the telescope, and thus may expand or be contracted, if necessary.

Since the apparatus for generating power by amplifying sunlight according to the present invention can be miniaturized, installation space is not limited, thus installation cost is reduced.

Further, since the apparatus for generating power by amplifying sunlight according to the present invention can collect a high level sunlight depending on the number of the light collection sheets installed thereat, an energy with a high efficiency may be obtained even in a region which has less sunlight.

It will be apparent to those skilled in the art that various modifications can be made to the above-described exemplary embodiments of the present invention without departing from the spirit or scope of the invention. Thus, it is intended that the present invention covers all such modifications provided they fall within the scope of the appended claims and their equivalents.

What is claimed is:
1. An apparatus for generating power by amplifying sunlight, comprising:
 a sunlight amplifying means configured to collect and amplify sunlight; and an energy storing means configured to support the sunlight amplifying means and to store an electric energy and a thermal energy generated from the sunlight amplifying means, wherein the sunlight amplifying means comprises:
   a first pipe formed of metallic material and configured to accommodate a gas, liquid, gel or solid type heat transfer medium therein;
   a second pipe configured to enclose the first pipe;
   a solar photovoltaic module installed between the first pipe and the second pipe; and
   a sunlight amplifying sheet configured with concave mirrors or convex lenses having predetermined shapes, and attached to the outer circumference of the second pipe so as to amplify sunlight, and wherein the sunlight amplifying sheet comprises a plurality of light collection sheets formed of concave mirrors or convex lenses, the plurality of light collection sheets are layered in a radial direction of the second pipe, and the concave mirrors or the convex lenses of the light collection sheets have sizes which become smaller or larger from sheet to sheet in the radial direction.

2. The apparatus of claim 1, wherein the concave mirrors or the convex lenses of the sunlight amplifying sheet are formed of transparent urethane material having a heat-resisting property, and also formed to be separately attachable and detachable to the light collection sheet.

3. The apparatus of claim 1, wherein the solar photovoltaic module is configured with a plurality of solar cells which are overlapped with each other centering on a concentric circle between the first pipe and the second pipe, wherein a third pipe is arranged between each two adjacent layers of the solar cells, and each of the third pipe and the first pipe have a protrusion for transferring heat.

4. The apparatus of claim 1, wherein the energy storing means comprises a rotational unit which rotatably supports the sunlight amplifying means, and a heated water tank which stores a water heated using the thermal energy of the sunlight amplifying means, wherein the heated water tank has an inlet port through which the water is introduced, and an outlet port through which the heated water is discharged.

5. The apparatus of claim 4, wherein the energy storing means comprises a heated water supply port through which heated water in the heated water tank is supplied to an external boiler.

6. The apparatus of claim 4, wherein the energy storing means comprises a vapor discharge port through which vapor in the heated water tank is supplied to an external turbine.

7. The apparatus of claim 4, wherein the energy storing means comprises a charging part having a plurality of storage batteries which store an electric energy generated from the solar photovoltaic module, and an inverter which transfers the current characteristic of the electric energy generated from the solar photovoltaic module.

8. The apparatus of claim 4, wherein the heated water tank comprises a first tank which stores a hot water heated using the thermal energy of the sunlight amplifying means, and a second tank which is arranged around the first tank and stores a warm water having a temperature relatively lower than that of the hot water in the first tank.

9. The apparatus of claim 4, wherein the energy storing means comprises a high pressure injector which is built in the energy storing means, extends to the outside of the energy storing means when being used, and injects cleaning water to the surface of the sunlight amplifying means.

10. The apparatus of claim 4, wherein the sunlight amplifying means is horizontally or vertically arranged to be rotatable by the rotational unit.

11. The apparatus of claim 10, wherein, when the sunlight amplifying means is vertically arranged, a funnel-shaped light collection member whose area is increased upward is installed at the upper end of the sunlight amplifying means, and at least one or more sunlight amplifying sheets are attached on the surface of the light collection member.

* * * * *